United States Patent
Wang

(10) Patent No.: US 12,284,773 B2
(45) Date of Patent: Apr. 22, 2025

(54) STRIP-LIKE SCREEN DISPLAY DEVICE

(71) Applicant: BOE Technology Group Co., Ltd., Beijing (CN)

(72) Inventor: Wenbin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/913,010

(22) PCT Filed: Nov. 8, 2021

(86) PCT No.: PCT/CN2021/129329
§ 371 (c)(1),
(2) Date: Sep. 20, 2022

(87) PCT Pub. No.: WO2022/242057
PCT Pub. Date: Nov. 24, 2022

(65) Prior Publication Data
US 2024/0224443 A1   Jul. 4, 2024

(30) Foreign Application Priority Data
May 19, 2021   (CN) .......................... 202121081569.7

(51) Int. Cl.
H05K 5/02   (2006.01)
G06F 3/041   (2006.01)
G09F 3/20   (2006.01)

(52) U.S. Cl.
CPC ......... *H05K 5/0217* (2013.01); *G06F 3/0416* (2013.01); *G09F 3/208* (2013.01); *H05K 5/0204* (2013.01); *H05K 5/0247* (2013.01)

(58) Field of Classification Search
None
See application file for complete search history.

(56) References Cited

U.S. PATENT DOCUMENTS 6,675,514 B1 * 1/2004 Salimes ................. G09F 3/208
40/575
10,702,078 B1 * 7/2020 Walker ................. A47F 5/0025
(Continued)

FOREIGN PATENT DOCUMENTS

CN      101206334 A     6/2008
CN      201796562 U     4/2011
(Continued)

OTHER PUBLICATIONS

PCT/CN2021/129329 international search report and written opinion.

*Primary Examiner* — Amare Mengistu
*Assistant Examiner* — Sarvesh J Nadkarni
(74) *Attorney, Agent, or Firm* — IPro, PLLC

(57) ABSTRACT

The present disclosure provides a strip-like screen display device, including: a strip-like display module including a display side and a non-display side arranged opposite to each other; and a strip-like shell, the strip-like shell being of a strip-like profile structure with an internal hollow cavity, at least one end of the strip-like shell being an opening end, the strip-like shell including a front side plate and a rear side plate arranged opposite to each other, the front side plate being provided with a display side opening, the strip-like display module being accommodated in the cavity of the strip-like shell and being inserted into or withdrawn out of the strip-like shell through the opening end, and a display side of the strip-like display module facing the display side opening.

12 Claims, 6 Drawing Sheets

(56) References Cited

U.S. PATENT DOCUMENTS

| | | | |
|---|---|---|---|
| 2005/0086843 A1 | 4/2005 | Buchanan et al. | |
| 2007/0234612 A1 | 10/2007 | Corbishley et al. | |
| 2018/0261136 A1* | 9/2018 | Taylor | G09F 3/204 |
| 2019/0189041 A1* | 6/2019 | Ishizaki | G06F 3/0416 |
| 2020/0066190 A1* | 2/2020 | Bacallao | G09F 3/02 |
| 2020/0211424 A1* | 7/2020 | Taylor | G09F 3/208 |
| 2022/0104363 A1* | 3/2022 | Ren | H05K 5/0017 |
| 2022/0335862 A1* | 10/2022 | Rössl | G06K 7/0008 |

FOREIGN PATENT DOCUMENTS

| | | |
|---|---|---|
| CN | 208477265 U | 2/2019 |
| CN | 210120742 U | 2/2020 |

\* cited by examiner

STRIP-LIKE SCREEN DISPLAY DEVICE

CROSS-REFERENCE TO RELATED APPLICATION

This application is the U.S. national phase of PCT Application No. PCT/CN2021/129329 filed on Nov. 8, 2021, which claims a priority of the Chinese patent application No. 202121081569.7 filed on May 19, 2021, which is incorporated herein by reference in its entirety.

TECHNICAL FIELD

The present disclosure relates to the field of display technology, in particular to a strip-like screen display device.

BACKGROUND

In the related art, a strip-like screen has been widely used in more and more scenarios, such as signs in buses, supermarket shelves and subway stations. Depending on different places and uses, strip-like screens with different functions such as on-board strip-like screen and bus guide screen occur. Due to various sizes, clear display and diversified functions, the strip-like screen has been used in retail, transportation, banking, enterprises and other industries.

Due to a leaping design and a lovable appearance of a liquid crystal strip-like screen, it is able to install the liquid crystal strip-like screen flexibly as compared with a conventional liquid crystal display screen with various limitations on an installation environment, and overturn a conventional Light-Emitting Diode (LED) monochromatic advertising screen, thereby to light the passions in advertisement and create new commercial values.

SUMMARY

An object of the present disclosure is to provide a strip-like screen display device, so as to provide a strip-like screen complete machine structure with simple assembly, easy operation and good structural strength.

The present disclosure provides the following technical solutions.

The present disclosure provides in some embodiments a strip-like screen display device, including: a strip-like display module including a display side and a non-display side arranged opposite to each other: and a strip-like shell, the strip-like shell being of a strip-like profile structure with an internal hollow cavity, at least one end of the strip-like shell being an opening end, the strip-like shell including a front side plate and a rear side plate arranged opposite to each other, the front side plate being provided with a display side opening, the strip-like display module being accommodated in the cavity of the strip-like shell and being inserted into or withdrawn out of the strip-like shell through the opening end, and a display side of the strip-like display module facing the display side opening.

In a possible embodiment of the present disclosure, the strip-like shell is an aluminum extrusion profile formed integrally.

In a possible embodiment of the present disclosure, the strip-like screen display device further includes a main control plate located in the cavity of the strip-like shell and at the non-display side of the strip-like display module, an orthogonal projection of the main control plate onto the front side plate at least partially overlaps the display side opening, and the main control plate is electrically coupled to the strip-like display module and configured to enable the strip-like display module to achieve a display function.

In a possible embodiment of the present disclosure, the strip-like screen display device further includes a back plate, the rear side plate of the strip-like shell is provided with a back plate opening, the back plate is assembled at the back plate opening, and the back plate is provided with a wiring opening for the wiring of the main control plate.

In a possible embodiment of the present disclosure, the main control plate is fixed on an inner surface of the back plate, and the inner surface is a surface of the back plate facing the hollow cavity of the strip-like shell.

In a possible embodiment of the present disclosure, thermally conductive silica gel is arranged between the main control plate and the back plate.

In a possible embodiment of the present disclosure, the strip-like screen display device further includes a touch unit and a touch circuit board configured to control the touch unit to achieve a touch function, the touch unit and the strip-like display module are formed integrally, or the touch unit is adhered to an outer surface of the front side plate, and the outer surface is a surface of the front side plate opposite to the hollow cavity.

In a possible embodiment of the present disclosure, the touch unit is electrically coupled to the touch circuit board, so as to enable the touch unit to achieve the touch function.

In a possible embodiment of the present disclosure, the strip-like screen display device further includes a near field communication (NFC) plate detachably assembled on the strip-like display module and electrically coupled to the main control plate.

In a possible embodiment of the present disclosure, the rear side plate of the strip-like shell is further provided with an NFC exposure notch, an orthogonal projection of the NFC plate onto the rear side plate at least partially overlaps the NFC exposure notch, and an NFC rear cover plate is detachably assembled at the NFC exposure notch.

In a possible embodiment of the present disclosure, an end cover is provided at the opening end.

In a possible embodiment of the present disclosure, the end cover includes a cover plate member configured to seal the opening end and an extension member arranged on the cover plate member and extending into the strip-like shell, the extension member is provided with at least one first screw hole, and the end cover is detachably coupled to the back plate through a first fastening screw screwing into the first screw hole.

In a possible embodiment of the present disclosure, the NFC rear cover plate is arranged close to at least one opening end of the strip-like shell, and the NFC rear cover plate is coupled to the rear side plate of the strip-like shell through at least one first fastening screw.

In a possible embodiment of the present disclosure, a mounting bracket is detachably assembled on an outer surface of the rear side plate to fix the strip-like screen display device on an object.

In a possible embodiment of the present disclosure, the mounting bracket includes a first assembly plate, a second assembly plate, and at least one connection beam coupled between the first assembly plate and the second assembly plate.

In a possible embodiment of the present disclosure, a plane where the first assembly plate is located is parallel to a plane where the second assembly plate is located, or the plane where the first assembly plate is angled relative to the plane where the second assembly plate is located by an angle $\alpha$, and the angle $\alpha$ is greater than 0° and smaller than 90°.

In a possible embodiment of the present disclosure, the strip-like shell further includes a top side plate and a bottom side plate arranged between the front side plate and the rear side plate, and an outer surface of the top side plate is perpendicular to the second assembly plate and/or an outer surface of the bottom side plate is perpendicular to the second assembly plate.

The present disclosure has the following beneficial effects.

According the embodiments of the present disclosure, the strip-like screen display device includes the strip-like shell and the strip-like display module, the strip-like shell is of a strip-like profile structure, the strip-like display module is capable of being withdrawn out of or inserted into the strip-like shell through the opening end, i.e., a pull-out design is adopted between the strip-like shell and the strip-like display module, the strip-like shell is formed through an extrusion die and then assembled with the strip-like display module. As a result, it is able to reduce an assembly clearance between the strip-like shell and the strip-like display module, maximize space utilization, reduce the quantity of detachable members, reduce the die cost, reduce a thickness of a body, ensure the strength of the structure, simplify the assembly and facilitate the operation, thereby to solve the problems in the conventional strip-like screen display device such as difficulty in assembly and weak structural strength.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In the related art, a strip-like screen display device has such problems as difficulty in assembly and weak structural strength. An object of the present disclosure is to provide a strip-like screen display device so as to simplify the assembly, facilitate the operation and improve the structural strength.

Figure 1:
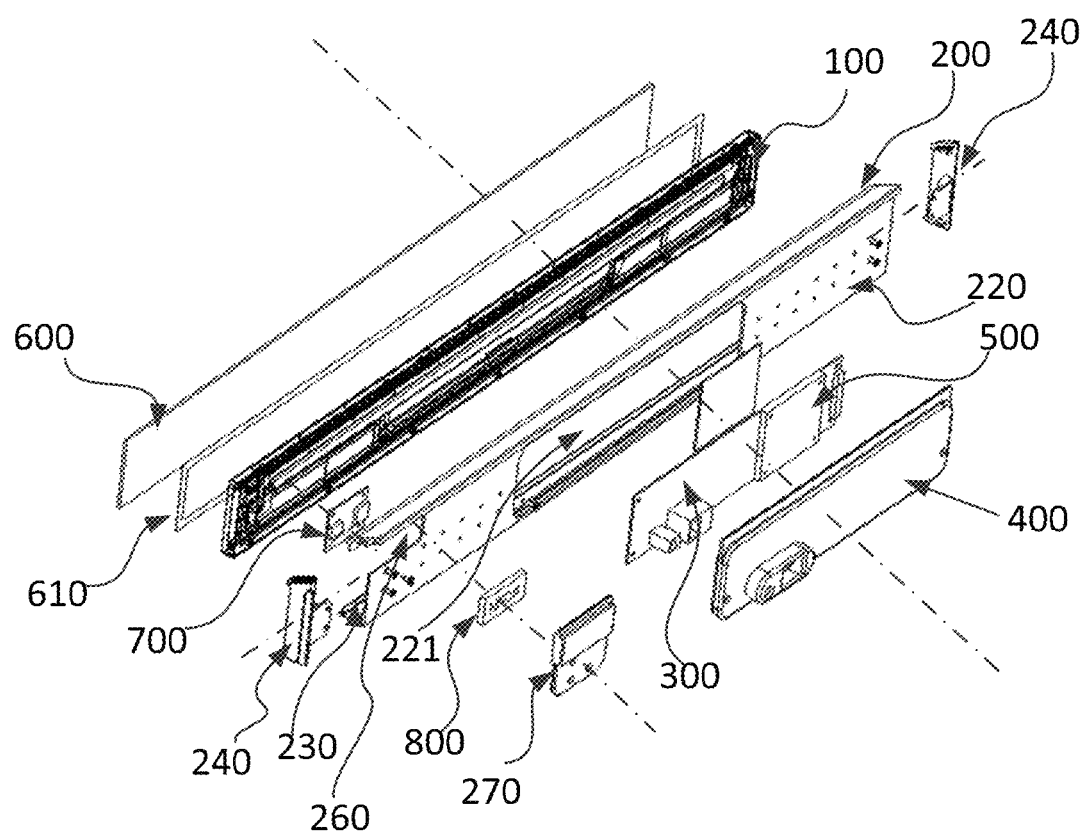
FIG. 1 is an exploded view of a strip-like screen display device without a mounting bracket according to one embodiment of the present disclosure.

As shown in FIG. 1, the present disclosure provides in some embodiments a strip-like screen display device, including a strip-like display module 100 and a strip-like shell 200. Taking a liquid crystal display screen as an example, the strip-like display module 100 includes a liquid crystal display panel and a backlight source, and the strip-like display module 100 includes a display side and a non-display side arranged opposite to each other. The strip-like shell 200 is of a strip-like profile structure with an internal hollow cavity, at least one end of the strip-like shell is an opening end 230, the strip-like shell 200 includes a front side plate 210 and a rear side plate 220 arranged opposite to each other, the front side plate 210 is provided with a display side opening 211, the strip-like display module 100 is accommodated in the cavity of the strip-like shell 200 and inserted into or withdrawn out of the strip-like shell 200 through the opening end 230, and a display side of the strip-like display module 100 faces the display side opening 211 so that four sides of the display side opening 211 of the strip-like shell 200 serves as a bezel of the strip-like display module 100.

In the above scheme, the strip-like shell 200 in the strip-like screen display device is of a strip-like profile structure with an internal hollow cavity, and at least one end of the strip-like shell is the opening end 230. The strip-like display module 100 is assembled with the strip-like shell 200 in such a manner that it is withdrawn out of or inserted into the strip-like shell 200 through the opening end 230, i.e., a pull-out design is adopted between the strip-like shell 200 and the strip-like display module 100. In this regard, the strip-like shell 200 is formed through an extrusion die, and then assembled with the strip-like display module 100. Through the pull-out design, it is able to reduce an assembly clearance between the strip-like shell 200 and the strip-like display module 100, maximize space utilization, reduce the quantity of detachable members, reduce the die cost, reduce a thickness of a body, ensure the strength of the structure, simplify the assembly and facilitate the operation, thereby to solve the problems in the conventional strip-like screen display device such as difficulty in assembly and weak structural strength.

In some embodiments of the present disclosure, the strip-like shell 200 is an aluminum extrusion profile formed integrally, and the aluminum extrusion profile has such advantages as simple forming process, low cost, and high structural strength. It should be appreciated that, in actual use, the strip-like shell 200 may also be made of any other metal materials, which will not be particularly defined herein.

In addition, in some embodiments of the present disclosure, as shown in FIG. 1, the strip-like screen display device further includes a main control plate 300 located in the cavity of the strip-like shell 200 and at the non-display side of the strip-like display module 100, an orthogonal projection of the main control plate 300 onto the front side plate 210 at least partially overlaps the display side opening 211, and the main control plate 300 is electrically coupled to the strip-like display module 100 and configured to enable the strip-like display module 100 to achieve a display function.

The main control plate 300 is electrically coupled to the strip-like display module 100 through a flat cable.

In addition, in some embodiments of the present disclosure, the strip-like screen display device further includes a back plate 400, the rear side plate 220 of the strip-like shell 200 is provided with a back plate opening 221, the back plate 400 is assembled at the back plate opening 221, the main control plate 300 is fixed on an inner surface of the back plate 400, the inner surface is a surface of the back plate 400 facing the hollow cavity of the strip-like shell 200, the back plate 400 is provided with a wiring opening for facilitating the wiring of the main control plate 300, and the wiring opening includes, for example, a power source outlet 402 and a communication interface 401.

Based on the above technical solution, the back plate opening 221 is separately formed in the rear side plate 220 of the strip-like shell 200, and the main control plate 300 and the back plate 400 are assembled at the back plate opening 221 separately, so as to facilitate the assembly and facilitate the detachment of such accessories as the main control plate 300 from the back plate 400 for maintenance.

In some embodiments of the present disclosure, thermally conductive silica gel 500 is arranged between the main control plate 300 and the back plate 400, so as to improve heat dissipation capability of the main control plate 300. The main control plate 300 is also fastened to the back plate 400 through screws, so as to fix the main control plate 300 to the back plate 400 and improve the structural stability.

In addition, in some embodiments of the present disclosure, the back plate 400 is detachably assembled on the strip-like shell 200, for example, through screw connection or snap-fit connection, and a specific connection mode between the back plate 400 and the strip-like shell 200 will not be particularly defined herein.

Figure 2:
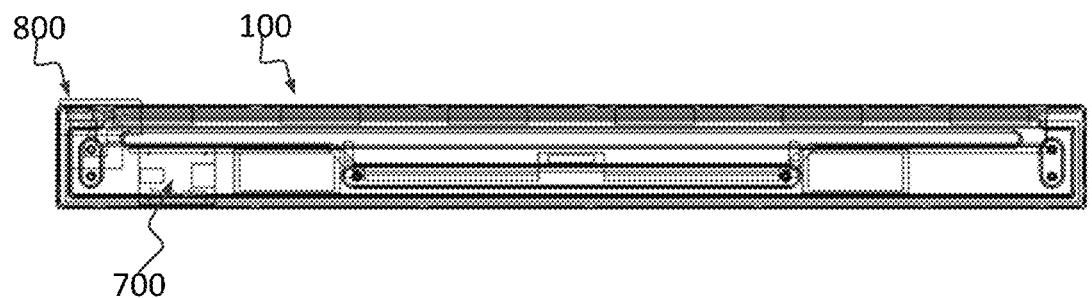
FIG. 2 is a schematic view showing a strip-like display module assembled with a touch circuit board and an NFC plate in the strip-like screen display device according to one embodiment of the present disclosure.
Figure 3:
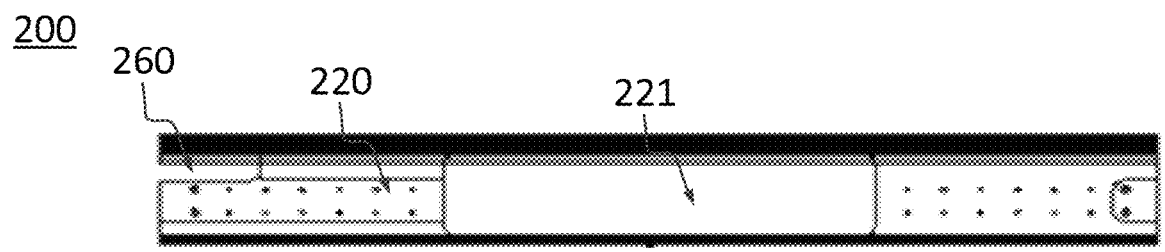
FIG. 3 is a schematic view showing a rear side plate of a strip-like shell in the strip-like screen display device according to one embodiment of the present disclosure.

In some embodiments of the present disclosure, as shown in FIG. 1 and FIG. 2, the strip-like screen display device further includes a touch unit 600 and a touch circuit board 700 configured to control the touch unit 600 to achieve a touch function, the touch unit 600 is adhered to an outer surface of the front side plate 210, the outer surface is a surface of the front side plate 210 opposite to the hollow cavity, the touch unit 600 is electrically coupled to the touch circuit board so as to enable the touch unit 600 to achieve the touch function.

For example, the strip-like display module 100 is provided with a first assembly member for the touch circuit board 700. The first assembly member is a space reserved on the strip-like display module for the touch circuit board 700, for example, the first assembly member is a structure such as an assembly groove. The touch circuit board 700 is detachably assembled on the first assembly member and electrically coupled to the main control plate 300.

In some embodiments of the present disclosure, the touch circuit board 700 is electrically coupled to the touch unit 600 through a flat cable.

In some embodiments of the present disclosure, the touch circuit board 700 is electrically coupled to the main control plate 300 through a flat cable.

When assembling the above strip-like screen display device, as shown in FIG. 2 to FIG. 5, the touch circuit board 700 is assembled on the strip-like display module 100 (e.g., the touch circuit board 700 is assembled on the first assembly member through an adhesive), and after the touch circuit board 700 is coupled to the strip-like display module 100, the strip-like display module 100 is inserted into the strip-like shell 200 through the opening end 230 of the strip-like shell 200. Then, as shown in FIG. 6, the main control plate 300 and the back plate 400 are assembled, lines of the strip-like display module 100 and connection lines of the touch circuit board 700 are coupled to the main control plate 300, and the back plate 400 is covered at and fastened to the back plate opening 221 in the rear side plate 220 of the strip-like shell 200.

In the above scheme, the touch unit 600 and the touch circuit board 700 in the strip-like screen display device are separately and detachably assembled on the strip-like display module 100 and the strip-like shell 200, so as to improve the commonality of the strip-like screen display device. When the strip-like screen display device is applied to a scenario where a touch function is required, the touch unit 600 and the touch circuit board 700 are provided: and when the strip-like screen display device is applied to a scenario where no touch function is required, the touch unit 600 and the touch circuit board 700 are not provided. In this regard, it is able to improve the flexibility of the strip-like screen display device.

Of course, it should be appreciated that, in some other embodiments of the present disclosure, the touch unit 600 and the strip-like display module 100 are formed integrally, i.e., touch signal lines provided with touch units are directly and integrally arranged on a base substrate of the strip-like display module, and at this time, the touch circuit board 700 is separately assembled on the strip-like display module 100 and electrically coupled to the main control plate 300. In some other embodiments of the present disclosure, the touch circuit board 700 is formed integrally with the main control plate 300.

In addition, in some embodiments of the present disclosure, as shown in FIG. 2 to FIG. 5, the strip-like screen display device further includes an NFC plate 800 detachably assembled on the strip-like display module and electrically coupled to the main control plate 300 to achieve an NFC wireless function of the strip-like screen display device.

In a possible embodiment of the present disclosure, the strip-like display module 100 is provided with a second assembly member for the NFC plate 800, and the NFC plate 800 is detachably assembled on the second assembly member. It should be appreciated that, the second assembly member is a space reserved on the strip-like display module for the NFC plate 800, for example, the second assembly member is a structure such as an assembly groove or a flat assembly surface.

When assembling the above strip-like screen display device, the NFC plate 800 is assembled on the strip-like display module 100 (e.g., the NFC plate 800 is assembled on the second assembly member through an adhesive), and after the NFC plate 800 is coupled to the strip-like display module 100, the strip-like display module 100 is inserted into the metal shell through the opening end 230 of the strip-like shell 200. Then, the main control plate 300 and the back plate 400 are assembled, connection lines of the strip-like display module 100 and connection lines on the NFC plate 800 are coupled to the main control plate 300, and the back plate 400 is covered at and fastened to the back plate opening 221 in the rear side plate 220 of the strip-like shell 200.

In the above scheme, the NFC plate 800 in the strip-like screen display device is separately and detachably assembled on the strip-like display module 100 and the strip-like shell 200, so as to improve the commonality of the strip-like screen display device and improve the flexibility of the strip-like screen display device.

Of course, it should be appreciated that, in some other embodiments of the present disclosure, the NFC plate 800 and the main control plate 300 are also formed integrally.

Figure 8:
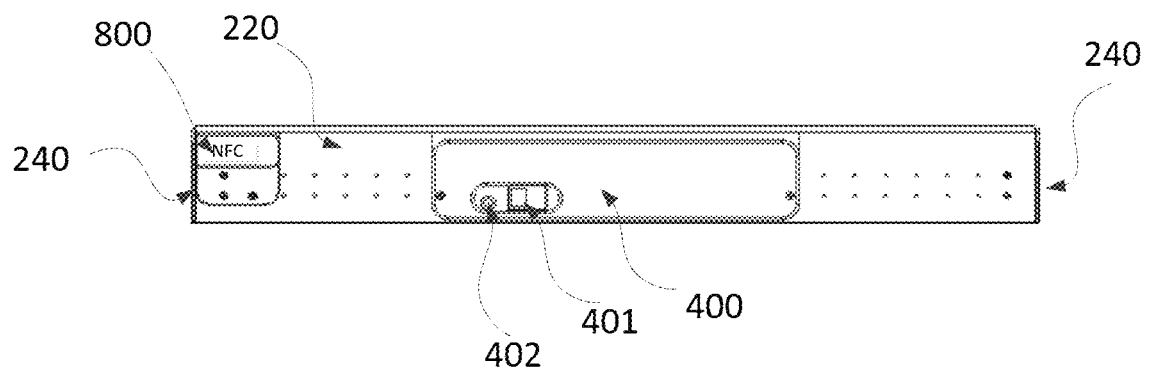
FIG. 8 is a schematic view showing the strip-like screen display device after the cover plate has been assembled at the opening end of the strip-like shell according to one embodiment of the present disclosure.

In addition, in some embodiments of the present disclosure, as shown in FIG. 6 and FIG. 8, the rear side plate 220 of the strip-like shell 200 is further provided with an NFC exposure notch 260, and the NFC plate 800 is arranged opposite to the NFC exposure notch 260, i.e., an orthogonal projection of the NFC plate 800 onto the rear side plate 220 at least partially overlaps the NFC exposure notch 260, and an NFC rear cover plate 270 is detachably assembled at the NFC exposure notch 260.

Based on the above scheme, the rear side plate 220 of the strip-like shell 200 is provided with the NFC exposure notch 260 to expose the NFC plate 800, so as to avoid signal of the NFC plate 800 from be shielded, and facilitate the disassembling and assembling of the NFC plate 800.

It should be appreciated that, the touch circuit board 700 and the NFC plate 800 are coupled to the strip-like display module 100 through flat cables, and the touch circuit board 700 and the NFC plate 800 are coupled to the main control plate 300 through flat cables. Of course, it should be appreciated that, specific electrical connection modes between each of the touch circuit board, the NFC plate 800 and each of the strip-like display module 100 and the main control plate 300 will not be particularly defined herein.

In some embodiments of the present disclosure, at least one end of the strip-like shell 200 is the opening end 230, and an end cover 240 is arranged at the opening end 230. For example, as shown in FIG. 1, both ends of the strip-like shell 200 are opening ends 230, and the end covers 240 are arranged at the two opening ends 230 respectively. The end cover 240 is made of metal, such as aluminum.

In some embodiments of the present disclosure, as shown in FIG. 1, the end cover 240 is provided with a cover plate member 241 configured to seal the opening end 230 and an extension member 242 arranged on the cover plate member 241 and extending into the strip-like shell 200. The extension member 242 is provided with a first screw hole 2421, and the end cover 240 is detachably coupled to the back plate 400 through a first fastening screw screwing through the first screw hole 2421.

In some embodiments of the present disclosure, as shown in FIG. 1, the NFC rear cover plate 270 is arranged close to at least one opening end 230 of the strip-like shell 200, and the NFC rear cover plate 270 is coupled to the rear side plate 220 of the strip-like shell 200 through at least one first fastening screw, i.e., the first fastening screw is used to fix both the end cover and the NFC rear cover plate at the same time. In this way, the end cover 240 shares a screw with the NFC rear cover plate 270, so it is able to simplify structure and facilitate the assembling. Of course, it should be appreciated that, in actual use, a connection mode between the NFC rear cover plate 270 and the end cover 240 will not be particularly defined herein.

Figure 10:
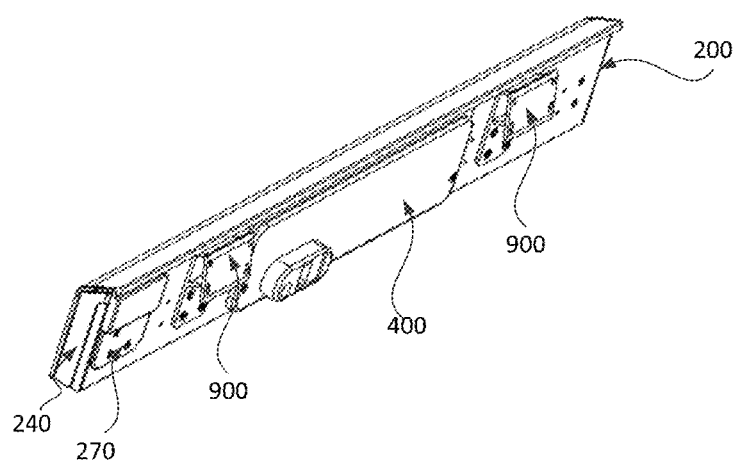
FIG. 10 is an isometric view of the strip-like screen display device after the mounting bracket has been assembled from a non-display side view according to one embodiment of the present disclosure.
Figure 11:
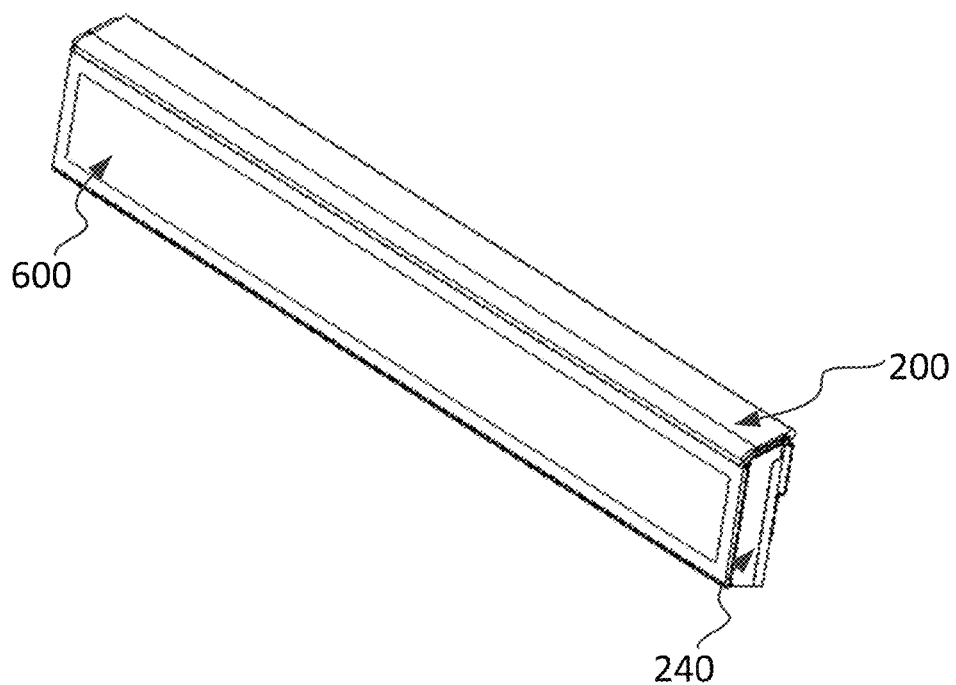
FIG. 11 is an isometric view of the strip-like screen display device after the mounting bracket has been assembled from a display side view according to one embodiment of the present disclosure.
Figure 12:
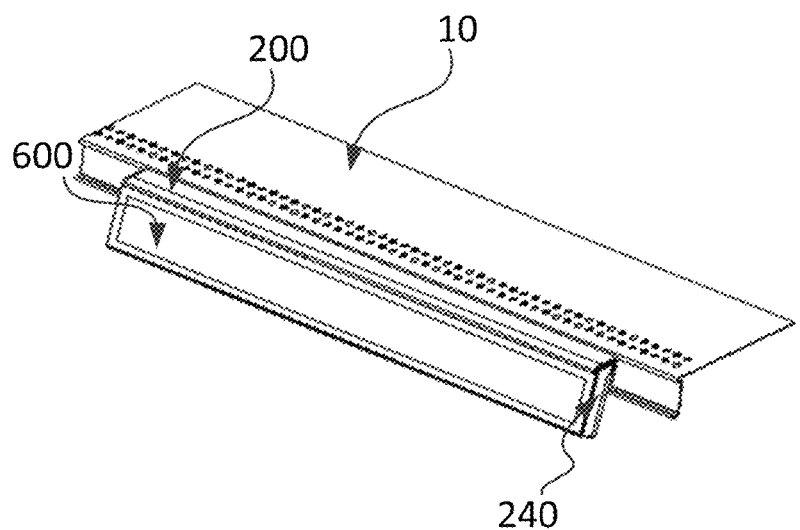
FIG. 12 is a solid view of the strip-like screen display device mounted on an object according to one embodiment of the present disclosure.

In addition, in some embodiments of the present disclosure, as shown in FIG. 10 and FIG. 12, a mounting bracket 900 is detachably assembled on an outer surface of the rear side plate 220 and configured to fix the strip-like screen display device on the object 10. The strip-like screen display device is assembled on the object 10 (such as a vehicle body) through the mounting bracket 900. For example, the mounting bracket 900 is coupled to the object 10 through screws.

Figure 13:
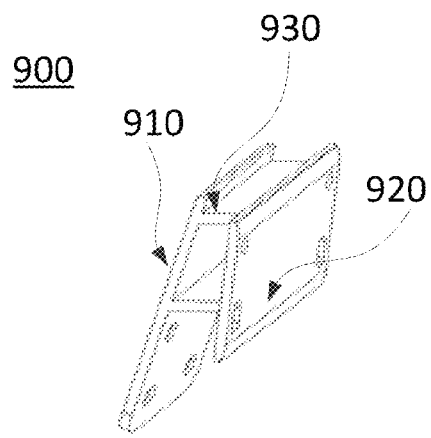
FIG. 13 is a solid view of the mounting bracket in the strip-like screen display device according to one embodiment of the present disclosure.
Figure 14:
FIG. 14 is a top view of the front side plate in FIG. 9.
Figure 15:
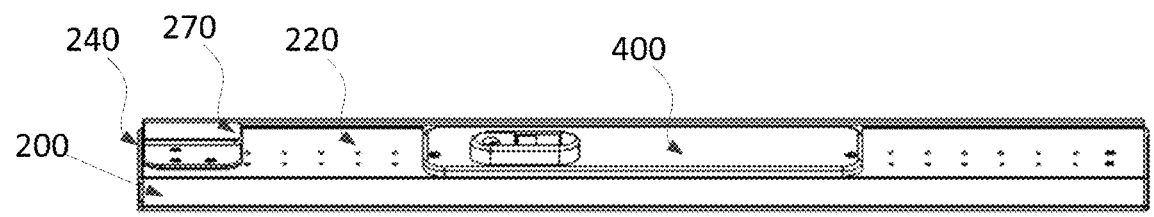
FIG. 15 is a bottom view of the front side plate in FIG. 9.
Figure 16:
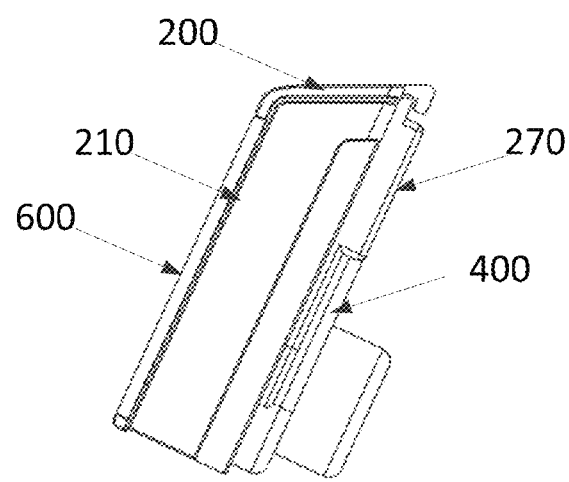
FIG. 16 is a left-side view of the front side plate in FIG. 9.
Figure 17:
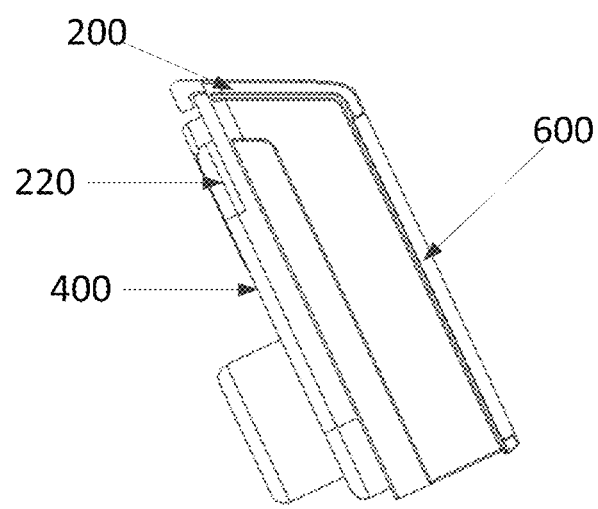
FIG. 17 is a right-side view of the front side plate in FIG. 9.

In some embodiments of the present disclosure, as shown in FIG. 13, the mounting bracket 900 includes a first assembly plate 910 fixed to the outer surface of the rear side plate 220, a second assembly plate 920 fixed to the object, and at least one connection beam 930 coupled between the first assembly plate 910 and the second assembly plate 920.

Based on the above scheme, the first assembly plate 910 of the mounting bracket is detachably arranged on the outer surface of the rear side plate, the second assembly plate 920 is detachably arranged on the object, and the connection beam 930 between the first assembly plate 910 and the second assembly plate 920 is used for connection and improving the strength.

In some embodiments of the present disclosure, the first assembly plate 910 and the second assembly plate 920 are arranged opposite to each other, and a plane where the first assembly plate is located is parallel to a plane where the second assembly plate is located.

In some other embodiments of the present disclosure, as shown in FIG. 13, the plane where the first assembly plate is located is angled relative to the plane where the second assembly plate is located by an angle $\alpha$, and the angle $\alpha$ is greater than 0° and smaller than 90°.

In this regard, the first assembly plate 910 and the second assembly plate 920 are arranged opposite to each other, i.e., one surface of the first assembly plate 910 faces one surface of the second assembly plate 920, and the plane where the first assembly plate 910 is located is angled relative to the plane where the second assembly plate 920 is located, i.e., the first assembly plate 910 and the second assembly plate 920 are arranged obliquely relative to each other. After the strip-like screen display device is assembled on the object, the display screen is arranged obliquely, so as to provide an optimal viewing angle and prevent a display effect from being adversely affected by the light reflection.

In different application scenarios, different types of mounting brackets 900 are provided so as to provide different viewing angles. For example, the angle α between the plane where the first assembly plate 910 is located and the plane where the second assembly plate 920 is located is greater than 0° and smaller than 90°.

In a possible embodiment of the present disclosure, the angle α between the plane where the first assembly plate 910 is located and the plane where the second assembly plate 920 is located is greater than or equal to 10° and smaller than or equal to 80°.

Furthermore, the angle α between the plane where the first assembly plate 910 is located and the plane where the second assembly plate 920 is located is greater than or equal to 45° and smaller than or equal to 80°.

In a possible embodiment of the present disclosure, the angle α between the plane where the first assembly plate 910 is located and the plane where the second assembly plate 920 is located is 65°, so as to provide the optimal viewing angle.

For example, the plane where the first assembly plate 910 is located refers to a plane where an extension direction of the first assembly plate 910 is located, and the plane where the second assembly plate 920 is located refers to a plane where an extension direction of the second assembly plate 920 is located.

Figure 5:
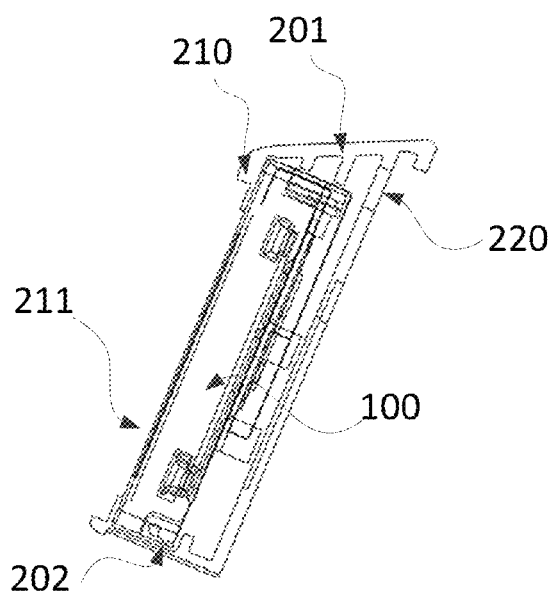
FIG. 5 is a side view of the strip-like screen display device when the strip-like display is assembled with and the strip-like shell according to one embodiment of the present disclosure.
Figure 6:
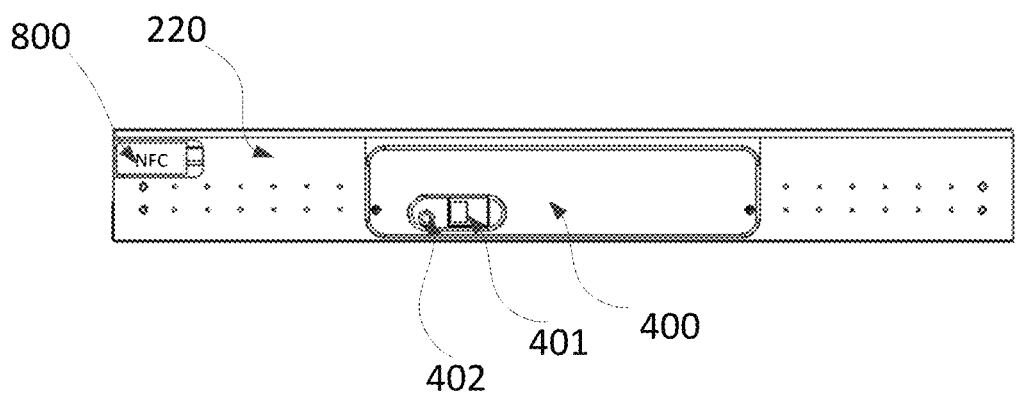
FIG. 6 is a schematic view showing the strip-like screen display device after a back plate is assembled with the strip-like shell according to one embodiment of the present disclosure.

In addition, in some embodiments of the present disclosure, as shown in FIG. 5, the strip-like shell 200 further includes a top side plate 201 and a bottom side plate 202 arranged between the front side plate 210 and the rear side plate 220, and an outer surface of the top side plate 201 is perpendicular to the second assembly plate 920. In this regard, the second assembly plate 920 is assembled on the object, so the angle between the second assembly plate 920 and the first assembly plate 910 is just an angle between the second assembly plate 920 and the display screen. Through designing an outer surface of the top side plate to be perpendicular to the second assembly plate 920, when the second assembly plate 920 is assembled on a vertical plane of the object, the outer surface of the top side plate is arranged horizontally or approximately horizontally, so as to improve the appearance as well as the user experience.

In some other embodiments of the present disclosure, an outer surface of the bottom side plate 202 is perpendicular to the second assembly plate 920. Similarly, when the second assembly plate 920 is assembled on a vertical plane of the object, the outer surface of the bottom side plate is arranged horizontally or approximately horizontally, so as to improve the appearance as well as the user experience.

It should be appreciated that, in some other embodiments of the present disclosure, the top side plate 201 is also perpendicular to the front side plate 210.

Taking the strip-like screen display device in FIG. 1 as an example, the assembling of the strip-like screen display device in the embodiments of present disclosure includes the following steps.

As shown in FIG. 2, the touch circuit board 700 and the NFC plate 800 are assembled on the strip-like display module 100, and the touch circuit board 700 is coupled to the strip-like display module 100.

Figure 4:
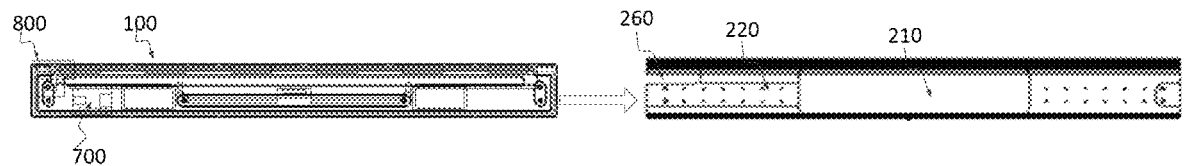
FIG. 4 is a schematic view showing the assembling of the strip-like display module with the strip-like shell of the strip-like screen display device in a pull-out mode according to one embodiment of the present disclosure.

As shown in FIG. 4, the strip-like display module 100 with the touch circuit board 700 and the NFC plate 800 is inserted into the metal shell through the opening end 230 of the strip-like shell 200.

As shown in FIG. 6, the main control plate 300 and the back plate 400 are assembled, the lines of the strip-like display module 100, the connection lines on the touch circuit board 700 and the connection lines on the NFC plate 800 are coupled to the main control plate 300, and the back plate 400 is covered at and fastened to the back plate opening 221 in the rear side plate 220 of the strip-like shell 200.

Figure 7:
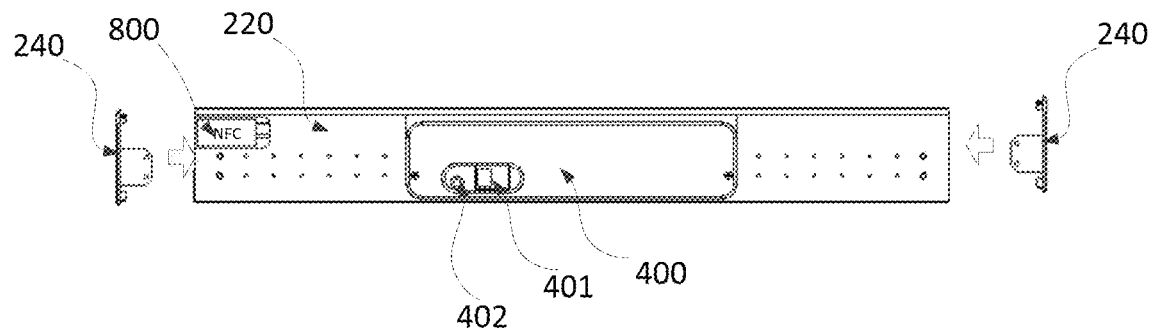
FIG. 7 is a schematic view showing the strip-like screen display device when an end cover is assembled at an opening end of the strip-like shell according to one embodiment of the present disclosure.

As shown in FIG. 7, the end covers 240 are inserted at both ends of the strip-like shell 200, and as shown in FIG. 8, the NFC rear cover plate 270 is covered and fastened through screws.

Figure 9:
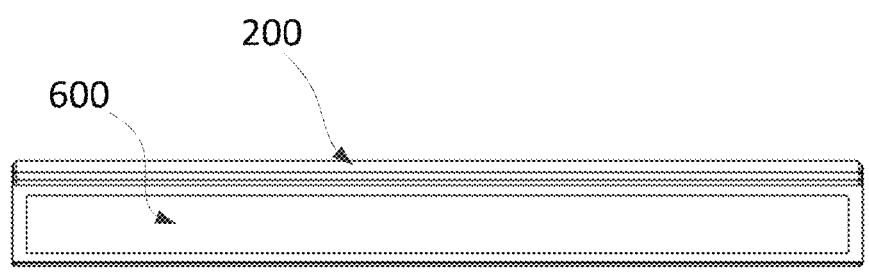
FIG. 9 is a schematic view showing a front side plate of the strip-like shell assembled with a touch unit in the strip-like screen display device according to one embodiment of the present disclosure.

As shown in FIG. 9, the touch unit 600 is adhered onto the outer surface of the front side plate 210 of the strip-like shell 200 through a double-sided adhesive tape 610, and the touch unit 600 is electrically coupled to the touch plate to complete the assembling.

According to the embodiments of the present disclosure, the pull-out design is adopted for the strip-like shell 200 of the strip-like screen display device, so it is able to reduce an assembly clearance between the strip-like shell and the strip-like display module, maximize space utilization, reduce the quantity of detachable members, reduce the die cost, reduce a thickness of a body, ensure the strength of the structure, simplify the assembly and facilitate the operation, thereby to solve the problems in the conventional strip-like screen display device such as difficulty in assembly and weak structural strength. In addition, through an oblique structure, it is able to provide an optimal viewing angle, thereby to prevent the display effect from being adversely affected due to the light reflection.

The strip-like screen display device in the embodiments of the present disclosure may be applied to various application scenarios, such as signs for buses, supermarket shelves, and subway station.

Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A strip-like screen display device, comprising:
   a strip-like display module comprising a display side and a non-display side arranged opposite to each other; and a strip-like shell, the strip-like shell being of a strip-like profile structure with an internal hollow cavity, at least one end of the strip-like shell being an opening end, the strip-like shell comprising a front side plate and a rear side plate arranged opposite to each other, the front side plate being provided with a display side opening, the strip-like display module being accommodated in the cavity of the strip-like shell and being inserted into or withdrawn out of the strip-like shell through the opening end, and a display side of the strip-like display module facing the display side opening;

the strip-like screen display device further comprising a mounting bracket detachably assembled on an outer surface of the rear side plate to fix the strip-like screen display device on an object;

wherein the mounting bracket comprises a first assembly plate, a second assembly plate, and at least one connection beam coupled between the first assembly plate and the second assembly plate;

wherein the first assembly plate, the second assembly plate and the connection beam are integrally formed;

wherein the strip-like screen display device further comprises a main control plate located in the cavity of the strip-like shell and at the non-display side of the strip-like display module, wherein an orthogonal projection of the main control plate onto the front side plate at least partially overlaps the display side opening, and the main control plate is electrically coupled to the strip-like display module and configured to enable the strip-like display module to achieve a display function;

wherein the strip-like screen display device further comprises a back plate, wherein the rear side plate of the strip-like shell is provided with a back plate opening, the back plate is assembled at the back plate opening, and the back plate is provided with a wiring opening for the wiring of the main control plate;

wherein the strip-like screen display device further comprises a near field communication (NFC) plate detachably assembled on the strip-like display module and electrically coupled to the main control plate;

wherein the rear side plate of the strip-like shell is further provided with an NFC exposure notch, an orthogonal projection of the NFC plate onto the rear side plate at least partially overlaps the NFC exposure notch, and an NFC rear cover plate is detachably assembled at the NFC exposure notch.

2. The strip-like screen display device according to claim 1, wherein the strip-like shell is an aluminum extrusion profile formed integrally.

3. The strip-like screen display device according to claim 1, wherein the main control plate is fixed on an inner surface of the back plate, and the inner surface is a surface of the back plate facing the hollow cavity of the strip-like shell.

4. The strip-like screen display device according to claim 1, wherein thermally conductive silica gel is arranged between the main control plate and the back plate.

5. The strip-like screen display device according to claim 1, further comprising a touch unit and a touch circuit board configured to control the touch unit to achieve a touch function, wherein the touch unit and the strip-like display module are formed integrally, or the touch unit is adhered to an outer surface of the front side plate, and the outer surface is a surface of the front side plate opposite to the hollow cavity.

6. The strip-like screen display device according to claim 5, wherein the touch unit is electrically coupled to the touch circuit board, so as to enable the touch unit to achieve the touch function.

7. The strip-like screen display device according to claim 1, wherein an end cover is provided at the opening end.

8. The strip-like screen display device according to claim 7, wherein the end cover comprises a cover plate member configured to seal the opening end and an extension member arranged on the cover plate member and extending into the strip-like shell, the extension member is provided with at least one first screw hole, and the end cover is detachably coupled to the back plate through a first fastening screw screwing into the first screw hole.

9. The strip-like screen display device according to claim 8, wherein the NFC rear cover plate is arranged close to at least one opening end of the strip-like shell, and the NFC rear cover plate is coupled to the rear side plate of the strip-like shell through at least one first fastening screw.

10. The strip-like screen display device according to claim 1, wherein a plane where the first assembly plate is located is parallel to a plane where the second assembly plate is located, or the plane where the first assembly plate is angled relative to the plane where the second assembly plate is located by an angle α, and the angle α is greater than 0° and smaller than 90°.

11. The strip-like screen display device according to claim 10, wherein the strip-like shell further comprises a top side plate and a bottom side plate arranged between the front side plate and the rear side plate, and an outer surface of the top side plate is perpendicular to the second assembly plate and/or an outer surface of the bottom side plate is perpendicular to the second assembly plate.

12. The strip-like screen display device according to claim 1, wherein the strip-like shell further comprises a top side plate and a bottom side plate arranged between the front side plate and the rear side plate, and an outer surface of the top side plate is perpendicular to the second assembly plate and/or an outer surface of the bottom side plate is perpendicular to the second assembly plate.

\* \* \* \* \*